United States Patent
Zhou et al.

(10) Patent No.: US 10,218,331 B2
(45) Date of Patent: Feb. 26, 2019

(54) QUADRATURE HYBRID WITH MULTI-LAYER STRUCTURE

(71) Applicant: TELEFONAKTIEBOLAGET LM ERICSSON (PUBL), Stockholm (SE)

(72) Inventors: Bo Zhou, Nanjing (CN); Yang Ji, Nanjing (CN); Junyou Chen, Jiangsu (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 14 days.

(21) Appl. No.: 15/309,982

(22) PCT Filed: May 12, 2014

(86) PCT No.: PCT/CN2014/077268
§ 371 (c)(1),
(2) Date: Nov. 9, 2016

(87) PCT Pub. No.: WO2015/172287
PCT Pub. Date: Nov. 19, 2015

(65) Prior Publication Data
US 2017/0163235 A1    Jun. 8, 2017

(51) Int. Cl.
*H01P 5/16* (2006.01)
*H03H 7/01* (2006.01)
(Continued)

(52) U.S. Cl.
CPC ........... *H03H 7/0115* (2013.01); *H01P 5/187* (2013.01); *H01P 5/227* (2013.01); *H03H 7/0138* (2013.01);
(Continued)

(58) Field of Classification Search
CPC ....................................................... H03H 7/48
(Continued)

(56) References Cited

U.S. PATENT DOCUMENTS 5,382,925 A * 1/1995 Hayashi ................... H03H 1/00
333/112
5,929,729 A * 7/1999 Swarup .................. H01P 3/085
333/116

(Continued)

FOREIGN PATENT DOCUMENTS

| CN | 102354777 A | 2/2012 |
|----|-------------|--------|
| WO | WO 2013/102964 A1 | 7/2013 |
| WO | 2014063324 A1 | 5/2014 |

OTHER PUBLICATIONS

Lang, Monolithic Planar Quadrature Hybrid, Motorola Technical Developments, vol. 16, p. 27, Aug. 1992.
(Continued)

*Primary Examiner* — Dean Takaoka (57) ABSTRACT

The disclosure provides a quadrature hybrid. The quadrature hybrid has a first, second, third and fourth ports. The quadrature hybrid comprises: a substrate having a plurality of dielectric layers; a first, second and third capacitors, each capacitor having a first predetermined number of layers each being arranged on one of the plurality of dielectric layers; and a first, second, third and fourth inductors, each inductor having a second predetermined number of layers each being arranged on one of the plurality of dielectric layers.

7 Claims, 8 Drawing Sheets

(51) Int. Cl.
*H01P 5/18* (2006.01)
*H03H 7/075* (2006.01)
*H03H 7/09* (2006.01)
*H01P 5/22* (2006.01)
*H01G 4/40* (2006.01)
*H03H 1/00* (2006.01)

(52) U.S. Cl.
CPC .............. *H03H 7/075* (2013.01); *H03H 7/09* (2013.01); *H01G 4/40* (2013.01); *H03H 2001/0021* (2013.01); *H03H 2001/0085* (2013.01)

(58) Field of Classification Search
USPC .......................................... 333/112, 117, 118
See application file for complete search history.

(56) References Cited

U.S. PATENT DOCUMENTS

| 6,806,789 | B2* | 10/2004 | Bawell | H03H 7/21 333/117 |
| 6,819,200 | B2* | 11/2004 | Zhao | H03H 7/42 333/25 |
| 7,414,478 | B2 | 8/2008 | Elmala et al. | |
| 8,704,611 | B2* | 4/2014 | Podell | H03H 7/46 333/118 |
| 2003/0137363 | A1 | 7/2003 | Bawell et al. | |
| 2012/0161898 | A1* | 6/2012 | Gorbachov | H01P 5/185 333/112 |
| 2012/0200370 | A1* | 8/2012 | Wright | H01P 5/227 333/117 |
| 2012/0326780 | A1* | 12/2012 | Balm | H01P 5/185 330/124 R |

OTHER PUBLICATIONS

Piatnitsa, et al., Design and Investigation of Miniaturized High-Performance LTCC Filters for Wireless Communications, Proceedings of the 37th European Microwave Conference, p. 544-547, Oct. 2007.

* cited by examiner

QUADRATURE HYBRID WITH MULTI-LAYER STRUCTURE

TECHNICAL FIELD

The disclosure relates to microwave circuit, and more particularly, to a quadrature hybrid with a multi-layer structure.

BACKGROUND

Recently, electronic devices are evolving towards miniaturization, lower cost and higher performance. In order to meet this requirement, passive components, which occupy the largest area in circuit design, need to be improved. In the traditional Surface Mounted Technology (SMT), most of passive components used in electronic devices, such as capacitors and inductors, are discrete components that take up a large real estate of a Printed Circuit Board (PCB). Meanwhile, their performances and reliabilities are not good due to large parasitic inductances caused by long interconnections between components and solder joints.

The System-On-Package (SOP) concept where components are integrated as part of a package housing an electronic device is an attractive option to build wireless communication modules. This concept provides a potential for higher integration, leading to a more compact module size that is critical for portable applications. In addition, SOP components have reduced cost since they eliminate the need for discrete components and have shortened assembly time. Also, their performances are superior to those of on-chip components.

Recent progresses in commercial communications have created a need for RF components having more compact sizes. Lumped elements can provide circuit miniaturization at low frequency while having spurious-free responses at high frequency. Therefore, it is of particular interest to implement quadrature hybrids with lumped elements. The Low Temperature Co-fired Ceramic (LTCC) technique is a technique for integrating passive components. However, for SOP applications, the LTCC technique has two major disadvantages: it has a high fabrication cost and it is incapable of dealing with high density interconnections. On the other hand, the low cost organic substrate technique has been well developed, whereby high-density interconnections are possible. Further, embedded passive technique has been proposed and become an attractive technology with benefits of lower parasitic parameter, better performance, compactness and higher reliability. The embedded passive technique based on organic substrate has been widely studied because of its advanced characteristics. It provides a cost-effective alternative to discrete passive components and LTCC devices.

Quadrature hybrid, also known as branch-line coupler, is an elemental component in various microwave circuits, such as balanced amplifiers, balanced mixers, phase shifters and beam-forming networks for array antennas. Conventional distributed-element quadrature hybrids, such as branch-line or Lange couplers, typically occupy large areas in Microwave Integrated Circuits (MICs) and it's impossible to implement a planar form quadrature hybrid in a limited circuit area, especially at low frequency. Semi-lumped and lumped elements can be used to construct quadrature hybrids for circuit size reduction. Semi-lumped and lumped element quadrature hybrids are constructed from lumped π or T network and/or lumped distributed networks equivalent to a transmission line section with an appropriate characteristic impedance and electrical length. However, conventional semi-lumped and lumped element quadrature hybrids can only achieve a fractional bandwidth of 1%~2% and are thus not suitable for wideband applications.

Reference [1], J. Yamasaki, I. Ohta, T. Kawai and Y. Kokubo, "Design of broadband semi-lumped and lumped element quadrature hybrids," 2005 IEEE MTT-S Int. Microwave Symp. Dig., vol. 3, pp. 1247-1250, June, 2005, discloses semi-lumped and lumped element quadrature hybrids. However, in this solution, lumped elements (e.g. capacitors and inductors) are located on the surface of a PCB, which is not desirable for size reduction. Semi-lumped elements (e.g., microstrip lines) also occupy a large area, especially at low frequency. Performances of the lumped elements on the PCB surface are vulnerable to environmental conditions, such as temperature, humidity and electromagnetic interferences. In addition, the Q-factors, or Q-values, of the equivalent capacitors and inductors are limited due to their planar structures. There are many parameters to be optimized in circuit design due to the complicated topology. Moreover, these quadrature hybrids can only achieve a fractional bandwidth of 25%.

Reference [2], J. Hou and Y. Wang, "A compact quadrature hybrid based on high-pass and low-pass lumped elements," IEEE Microw. Wireless Compon. Lett, vol. 17, no. 8, pp. 595-597, August, 2007, discloses a quadrature hybrid with a semi-planar structure. However, it cannot be used at low frequency (e.g., lower than 200 MHz) due to limited capacitance and inductance. The performances of its components are also vulnerable to environmental conditions (e.g., temperature, humidity). In addition, the Q-values of the equivalent capacitors and inductors are limited. Moreover, this quadrature hybrid can only achieve a fractional bandwidth of 18% while requiring relatively large capacitance and inductance, which is undesirable for size reduction.

Reference [3], Y. J. Lee and J. Y. Park, "Fully embedded lumped LC-quadrature hybrid coupler into organic packaging substrate for power sampling," Microw. Optical Technology Letters, vol. 51, no. 3, pp. 845-848, March, 2009, discloses a lumped LC-quadrature hybrid. It uses planar inductors and capacitors to shorten the length of the branch. However, it cannot be used at low frequency (e.g., lower than 200 MHz) either due to limited capacitance and inductance. In addition, the Q-values of the planar inductors are very low, which results in a high insertion loss of passive components. There are many parameters to be optimized in circuit design due to the complicated topology. Moreover, it can only achieve a fractional bandwidth of 10%.

Therefore, there is a need for an improved quadrature hybrid capable of overcoming at least some of the above problems in the prior art.

SUMMARY

It is an object of the disclosure to provide a quadrature hybrid that has a reduced size, high capacitance, inductance and Q-values, wide bandwidth and is less vulnerable to environmental conditions.

According to the disclosure, a quadrature hybrid is provided. The quadrature hybrid has a first, second, third and fourth ports and comprises: a substrate having a plurality of dielectric layers; a first, second and third capacitors, each capacitor having a first predetermined number of layers each being arranged on one of the plurality of dielectric layers; and a first, second, third and fourth inductors, each inductor having a second predetermined number of layers each being arranged on one of the plurality of dielectric layers. A first terminal lead of the first inductor and a first terminal lead of the first capacitor are connected to the first port. A first terminal lead of the second inductor and a second terminal lead of the first capacitor are connected to the second port. A first terminal lead of the third inductor and a second terminal lead of the third capacitor are connected to the third port. A first terminal lead of the fourth inductor and a first terminal lead of the third capacitor are connected to the fourth port. A second terminal lead of the first inductor and a second terminal lead of the fourth inductor are connected to a first terminal lead of the second capacitor. A second terminal lead of the second inductor and a second terminal lead of the third inductor are connected to a second terminal lead of the second capacitor.

In an embodiment, the first and second terminal leads of each inductor are arranged in a first direction. The first and second terminal leads of each capacitor are arranged in a second direction orthogonal to the first direction.

In an embodiment, projections of the first, second and third capacitors on a surface of the substrate are squares having a same first size. The first and second terminal leads of each capacitor extend from a pair of opposite sides of the square on which the capacitor is projected, respectively.

In an embodiment, projections of the first, second, third and fourth inductors on a surface of the substrate are squares having a same second size. The first and second terminal leads of each inductor extend from a pair of opposite sides of the square on which the inductor is projected, respectively.

In an embodiment, each capacitor is a vertically-interdigital-capacitor.

In an embodiment, each inductor is a spiral inductor.

In an embodiment, each layer of the substrate is made of Low Temperature Co-fired Ceramic (LTCC) material.

With the embodiments of the disclosure, each capacitor or inductor in the quadrature hybrid has a multi-layer structure, which allows the quadrature hybrid to have a reduced size when compared with the traditional quadrature hybrids having planar capacitors and inductors or microstrip lines. The multi-layered capacitors and inductors also provide higher capacitance, inductance and Q-values. In addition, since the capacitors and inductors are buried into the multi-layered substrate, the performance of the quadrature hybrid is less vulnerable to environmental conditions, such as temperature, humidity and electromagnetic interferences. The quadrature hybrid has a simple topology with only three capacitors and four inductors, which is easy for circuit design and optimization. Furthermore, this quadrature hybrid can achieve a wider fractional bandwidth than the traditional quadrature hybrids.

BRIEF DESCRIPTION OF THE DRAWINGS

The above and other objects, features and advantages will be more apparent from the following description of embodiments with reference to the figures, in which.

DETAILED DESCRIPTION

The embodiments of the disclosure will be detailed below with reference to the drawings. It should be noted that the following embodiments are illustrative only, rather than limiting the scope of the disclosure.

Figure 1:
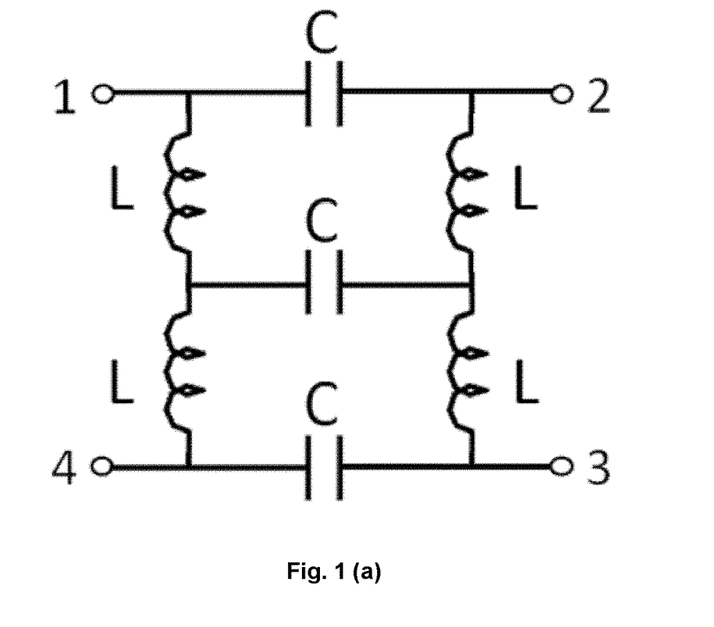
FIG. 1 shows an equivalent circuit of a quadrature hybrid according to an embodiment of the disclosure and its circuit simulation.

FIG. 1(a) shows an equivalent circuit of a quadrature hybrid according to an embodiment of the disclosure. As shown in FIG. 1 (a), the quadrature hybrid has four ports (Ports 1, 2, 3 and 4) and includes three capacitors and four inductors. Each of the capacitors has a capacitance of C. Each of the inductors has an inductance of L.

FIG. 1(b) shows simulation results (S-parameters) of the circuit shown in FIG. 1(a). In this simulation, it is assumed that Port 1 is the input port and, accordingly, Port 2, Port 3 and Port 4 are the direct, coupled and isolated ports, respectively. It can be appreciated by those skilled in the art that each of Port 2, Port 3 and Port 4 can alternatively serve as the input port and the roles of the other ports can vary accordingly. It is required here that the S-parameter S(1,1) (i.e., input port reflection coefficient) should be lower than −15 dB in the frequency range from 50 MHz to 70 MHz (which is referred to as "design requirement" hereinafter). As shown in FIG. 1(b), in order to meet the design requirement, C=51 pf and L=126 nH. In comparison, the quadrature hybrid in Reference [2] requires C=57 pf and L=143 nH to meet the design requirement (larger capacitance or inductance need a larger physical dimension to realize).

Figure 2:
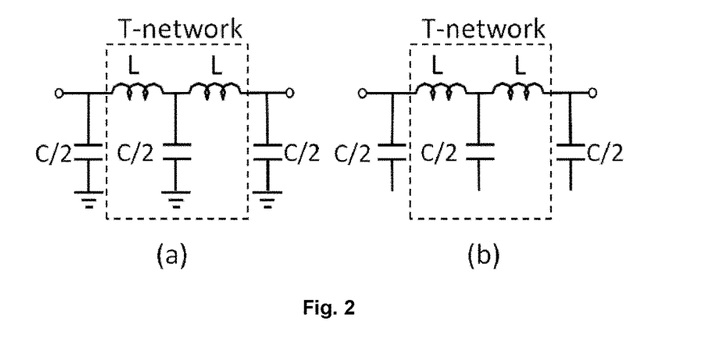
FIG. 2 shows odd-mode and even-mode equivalent half circuits of the quadrature hybrid shown in FIG. 1.

The equivalent circuit of the quadrature hybrid is symmetric and the odd-even analysis is applicable. FIG. 2 shows odd-mode (a) and even-mode (b) equivalent half circuits of the quadrature hybrid shown in FIG. 1. Each of the odd and even mode half circuits consists of a T-network. The cascaded connections of the half circuits can be analyzed using a known transmission matrix method. The values of L and C can be derived according to the following formulas:

$$L = \frac{Z_0}{2\pi f} \quad (1)$$

$$C = \frac{1}{2\pi f Z_0} \quad (2)$$

where f denotes the working frequency of the quadrature hybrid (e.g., 60 MHz) and $Z_0$ denotes the port characteristic impedance (i.e., 50Ω).

Figure 3:
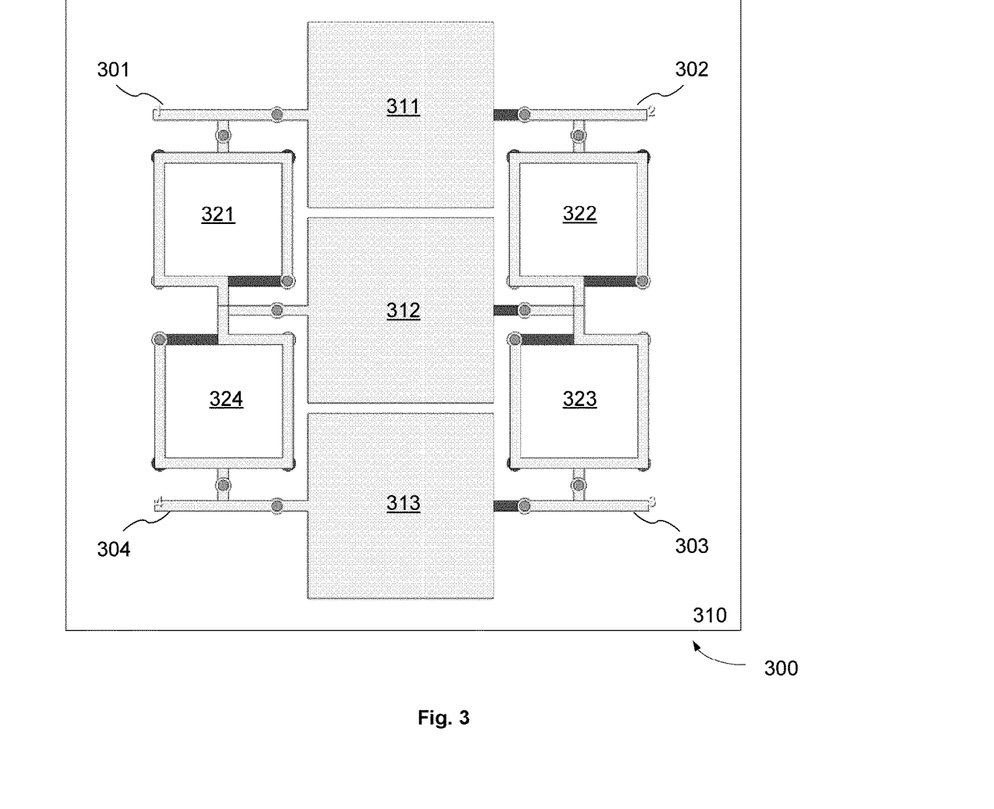
FIG. 3 is a top view of a quadrature hybrid according to an embodiment of the disclosure.

FIG. 3 is a top view of a quadrature hybrid 300 according to an embodiment of the disclosure. The quadrature hybrid 300 corresponds to the equivalent circuit shown in FIG. 1(a).

As shown in FIG. 3, the quadrature hybrid has a first port 301, a second port 302, a third port 303 and a fourth port 304. The quadrature hybrid 300 includes a substrate 310 having a plurality of dielectric layers (not shown in FIG. 3 and will be described later). The quadrature hybrid 300 further includes a first capacitor 311, a second capacitor 312 and a third capacitor 313. Each of the capacitors 311-313 has a number of layers each being arranged on one of the plurality of dielectric layers (not shown in FIG. 3 and will be described later). The quadrature hybrid 300 further includes a first inductor 321, a second inductor 322, a third inductor 323 and a fourth inductor 324. Each of the inductors 321-324 has a number of layers each being arranged on one of the plurality of dielectric layers (not shown in FIG. 3 and will be described later).

A first terminal lead of the first inductor 321 and a first terminal lead of the first capacitor 311 are connected to the first port 301.

A first terminal lead of the second inductor 322 and a second terminal lead of the first capacitor 311 are connected to the second port 302.

A first terminal lead of the third inductor 323 and a second terminal lead of the third capacitor 313 are connected to the third port 303.

A first terminal lead of the fourth inductor 324 and a first terminal lead of the third capacitor 313 are connected to the fourth port 304.

A second terminal lead of the first inductor 321 and a second terminal lead of the fourth inductor 324 are connected to a first terminal lead of the second capacitor 312.

A second terminal lead of the second inductor 322 and a second terminal lead of the third inductor 323 are connected to a second terminal lead of the second capacitor 312.

In an embodiment, as shown in FIG. 3, the first and second terminal leads of each of the inductors 321-324 are arranged in a first direction (vertical direction in FIG. 3). The first and second terminal leads of each of the capacitors 311-313 are arranged in a second direction (horizontal direction in FIG. 3) orthogonal to the first direction. In this way, the size of the entire quadrature hybrid can be further reduced.

In an embodiment, projections of the first, second and third capacitors 311-313 on a surface of the substrate 310 are squares having a same first size. The first and second terminal leads of each capacitor 311-313 extend from a pair of opposite sides of the square on which the capacitor is projected, respectively, as shown in FIG. 3. When the projections of the capacitors 311-313 on the surface of the substrate 310 are identical squares, the topology of the quadrature hybrid 300 can be simplified and thus the circuit design and optimization can be easier.

In an embodiment, projections of the first, second, third and fourth inductors 321-324 on a surface of the substrate 310 are squares having a same second size. The first and second terminal leads of each inductor 321-324 extend from a pair of opposite sides of the square on which the inductor is projected, respectively, as shown in FIG. 3. When the projections of the inductors 321-324 on the surface of the substrate 310 are identical squares, the topology of the quadrature hybrid 300 can be simplified and thus the circuit design and optimization can be easier.

In the following, the structures of the capacitors and inductors in the quadrature hybrid 300 shown in FIG. 3 will be described in detailed.

Figure 4:
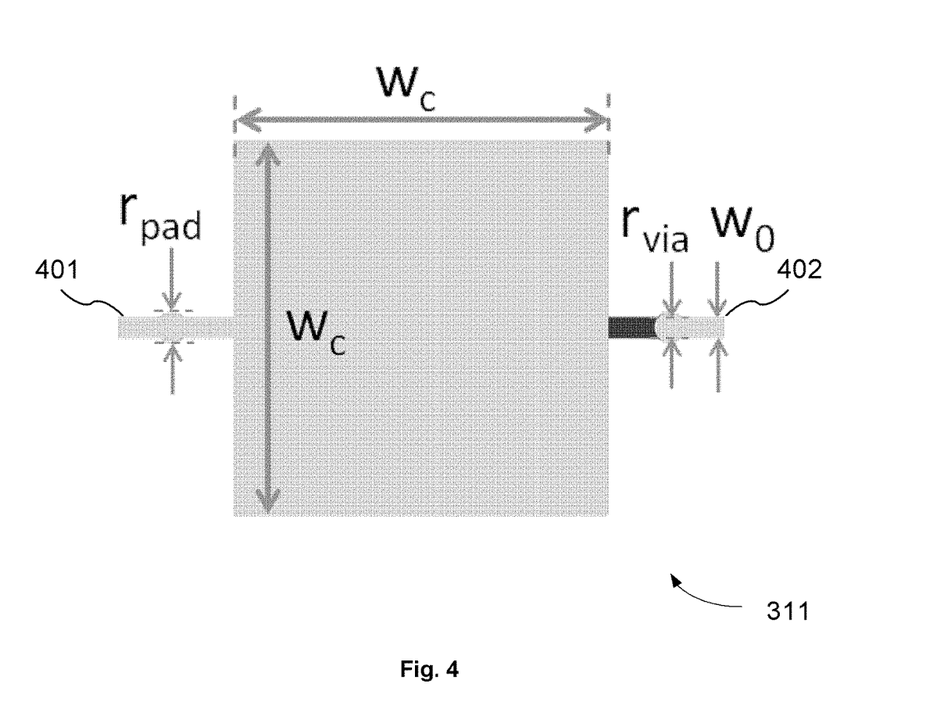
FIG. 4 is a top view of the multi-layered capacitor used in the quadrature hybrid shown in FIG. 3.

FIG. 4 is a top view of a capacitor (e.g., the capacitor 311) used in the quadrature hybrid 300 shown in FIG. 3. The other capacitors 312-313 may have the same structure as that of the capacitor 311.

As an example, the capacitor 311 can be a multi-layered Vertically-Interdigital-Capacitor (VIC). As shown in FIG. 4, the projection of the capacitor 311 on the surface of the substrate is a square having a width of $W_C$, which is a design parameter to be determined and will be described later. The capacitor 311 has a first terminal lead 401 and a second terminal lead 402. The first terminal lead 401 and the second terminal lead 402 extend from a pair of opposite sides of the square, respectively. As shown in FIG. 4, a pad is provided at each terminal lead and has a radius of $r_{pad}$. A via is associated with each pad and has a radius of $r_{via}$. Each terminal lead has a line width of $W_0$. Here, $r_{pad}$, $r_{via}$ and $W_0$ are design parameters which will be described later.

Figure 5:
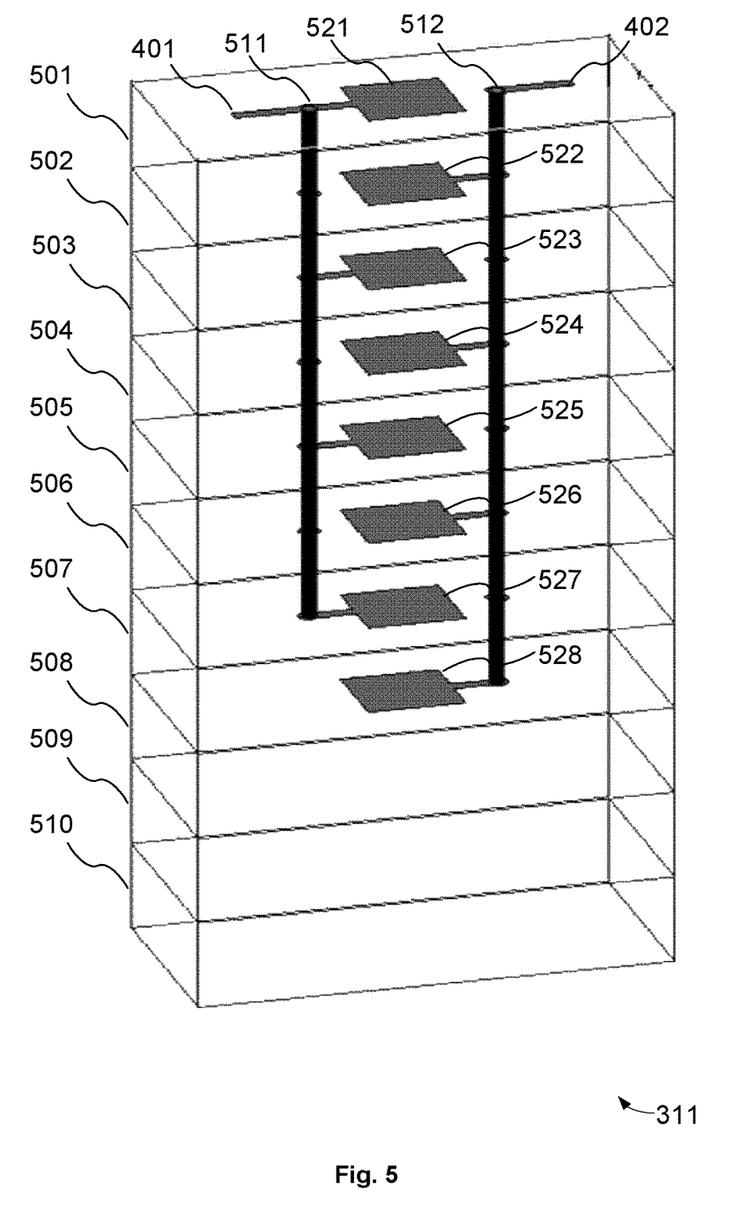
FIG. 5 is a three dimensional view of the multi-layered capacitor shown in FIG. 4.

FIG. 5 is a three dimensional view of the capacitor shown in FIG. 4. In the example shown in FIG. 5, the substrate includes ten dielectric layers 501-510 made of e.g., Low Temperature Co-fired Ceramic (LTCC) material. It can be appreciated by those skilled in the art that the substrate can also be a multilayered PCB or Liquid Crystal Polymer (LCP). The capacitor 311 (which is a VIC in this example) has eight layers 521-528. Eight layers of the VIC 311 are arranged on eight dielectric layers 501-508, respectively. The first, third, fifth and seventh layers 521, 523, 525 and 527 are connected to the first terminal lead 401 through a via 511. The second, fourth, sixth and eighth layers 522, 524, 526 and 528 are connected to the second terminal lead 402 through another via 512. It can be appreciated by those skilled in the art that the substrate and/or the capacitor may include more or less layers.

Figure 6:
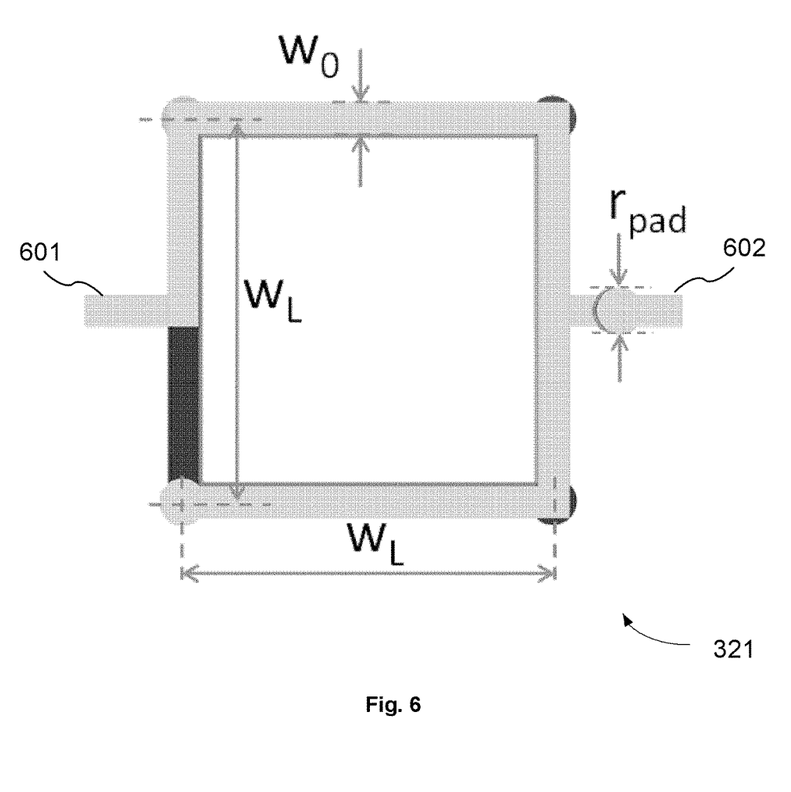
FIG. 6 is a top view of the multi-layered inductor used in the quadrature hybrid shown in FIG. 3.

FIG. 6 is a top view of an inductor (e.g., the inductor 321) used in the quadrature hybrid 300 shown in FIG. 3. The other inductors 322-324 may have the same structure as that of the inductor 321.

As an example, the inductor 321 can be a multi-layered spiral inductor. As shown in FIG. 6, the projection of the inductor 321 on the surface of the substrate is a square having a width of $W_L$, which is a design parameter to be determined and will be described later. The inductor 321 has a first terminal lead 601 and a second terminal lead 602. The first terminal lead 601 and the second terminal lead 602 extend from a pair of opposite sides of the square, respectively. As shown in FIG. 5, a pad is provided at each terminal lead and has a radius of $r_{pad}$. A via is associated with each pad and has a radius of $r_{via}$. The inductor 321 has a line width of $W_0$. Here, $r_{pad}$, $r_{via}$ and $W_0$ are design parameters which will be described later.

Figure 7:
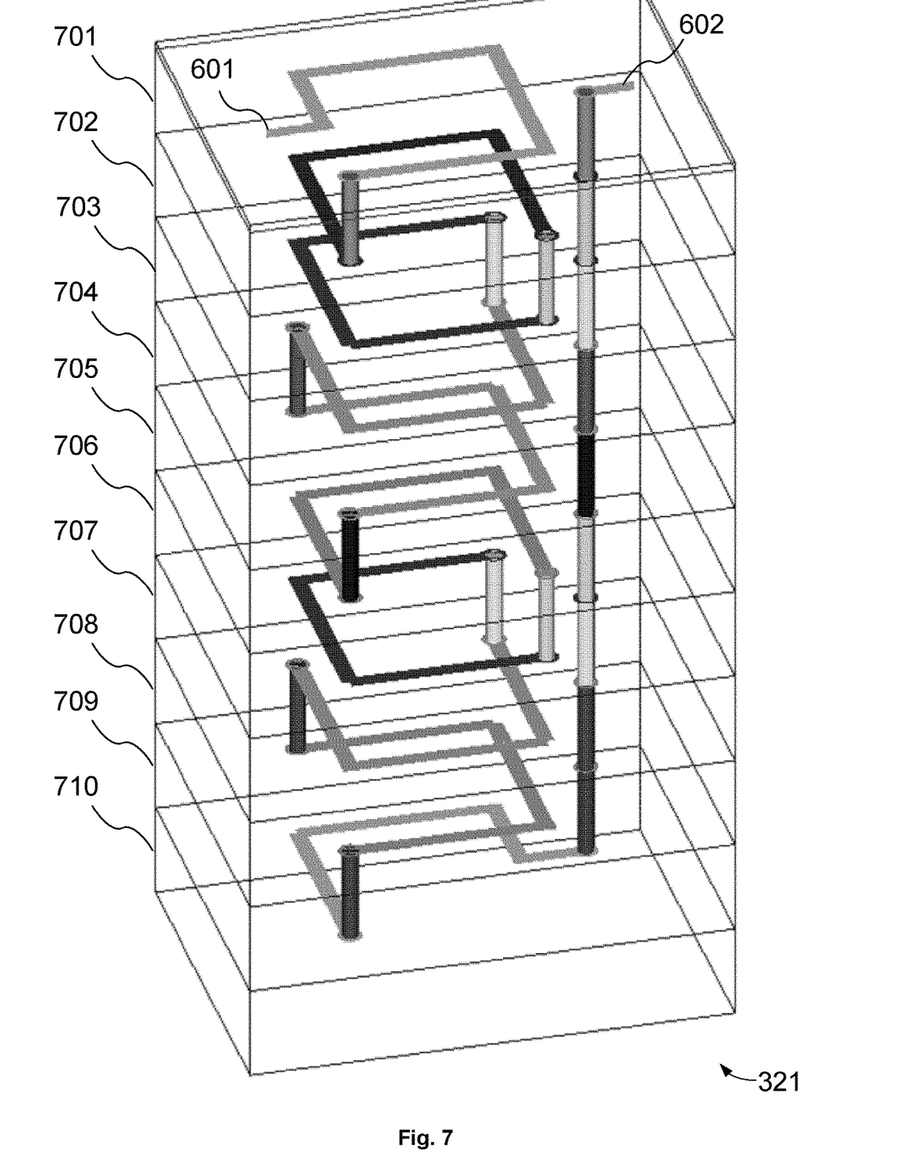
FIG. 7 is a three dimensional view of the multi-layered inductor shown in FIG. 6.

FIG. 7 is a three dimensional view of the inductor shown in FIG. 6. In the example shown in FIG. 7, the substrate includes ten dielectric layers 701-710 made of e.g., LTCC material. It can be appreciated by those skilled in the art that the substrate can also be a multilayered PCB or Liquid Crystal Polymer (LCP). The inductor 321 (which is a spiral inductor in this example) has nine layers (8.5 turns). Nine layers of the spiral inductor 321 are arranged on nine dielectric layers 701-709, respectively. The first terminal lead 601 is connected to the first layer. The first layer is connected to the second layer through a via, the second layer is connected to the third layer through a via, and so on. The second terminal lead 602 is connected to the ninth layer through a via. It can be appreciated by those skilled in the art that the substrate and/or the inductor may include more or less layers.

Next, a circuit design process for the quadrature hybrid will be discussed. In the following, it is assumed that the projections of the capacitors 311-313 on the surface of the substrate 310 are identical squares each having a width of $W_C$ and the projections of the inductors 321-324 on the surface of the substrate 310 are identical squares each having a width of $W_L$. In other words, the capacitors 311-313 are identical, each having a capacitance value of C; and the inductors 321-324 are identical, each having an inductance value of L.

In the following simulation, a Ferro-A6 material with a dielectric constant of 5.9 and a loss tangent of 0.002 is used for the LTCC substrate. Each LTCC layer has a post-fired thickness of 0.1 mm. It is assumed that $r_{pad}$=0.3 mm, $r_{via}$=0.2 mm and $W_0$=0.2 mm. It is further assumed that the working frequency of the quadrature hybrid f=60 MHz. AWR MWO and AXIEM solver are used as circuit and electromagnetic simulators, respectively.

At step S1, the values of L and C are determined based on the equivalent circuit shown in FIG. 1(a). As noted above, with the MWO simulator, these values can be determined as: L=126 nH and C=51 pf.

At step S2, electromagnetic models are established for the VICs and spiral inductors using the AXIEM simulator to determine the parameters $W_C$ and $W_L$, such that their performances can match those of their equivalent elements.

At step S3, the entire quadrature hybrid is simulated and optimized in the AXIEM simulator. However, the electromagnetic simulation results of the quadrature hybrid may not match those of its equivalent circuit due to parasitic effects and mutual coupling of passive elements.

At step S4, the electromagnetic simulation results of the VICs and spiral inductors are considered in the MWO simulator and the values of L and C are adjusted such that the overall performance can meet the requirements for the quadrature hybrid. Then, a pair of new values for L and C can be obtained: L'=129.2 nH and C'=48.36 pf.

At step S5, the electromagnetic models of the VICs and spiral inductors are combined in the AXIEM simulator to determine the final values for the parameters $W_C$ and $W_L$.

Figure 8:
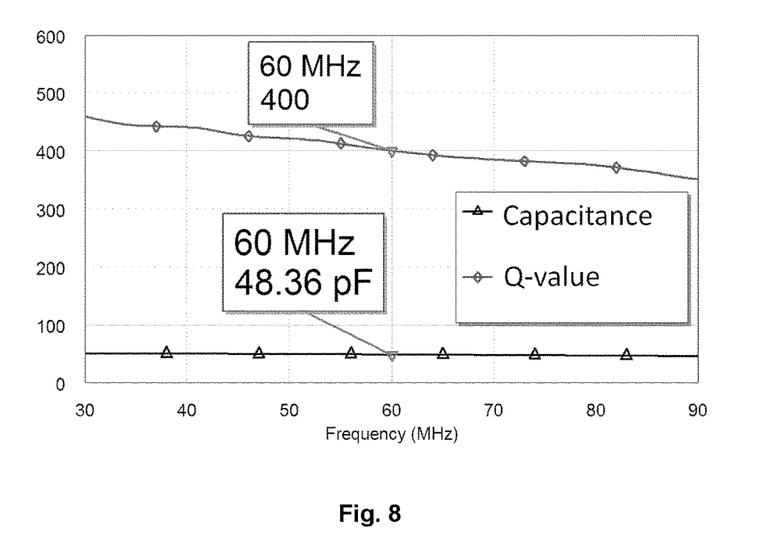
FIG. 8 shows electromagnetic simulation results of the multi-layered capacitor shown in FIGS. 4 and 5.

In order to provide the capacitance value of C'=48.36 pf at 60 MHz, $W_C$=3.6 mm is determined and its Q-value is 400 (absolute value) at 60 MHz, as shown in FIG. 8. It can be seen that the multi-layered structure of the VIC provides higher capacitance and Q-values than the traditional planar capacitors.

Figure 9:
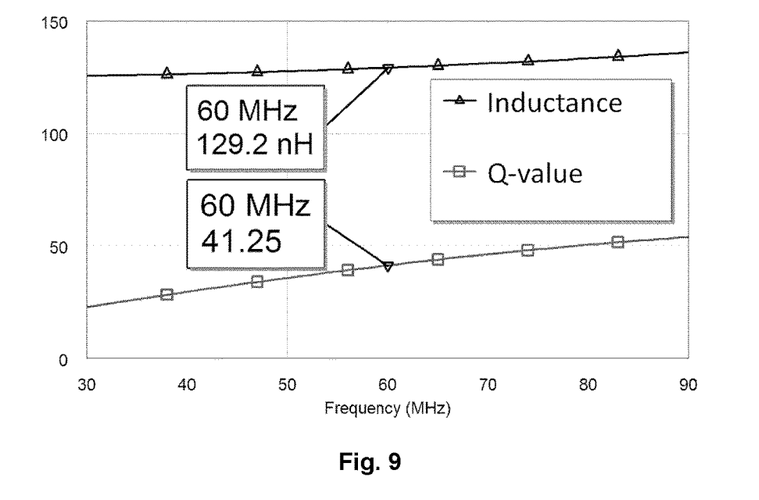
FIG. 9 shows electromagnetic simulation results of the multi-layered inductor shown in FIGS. 6 and 7.

In order to provide the inductance values of L'=129.2 nH at 60 MHz, it can be determined that $W_L$=2.49 mm and its Q-value is 41.25 (absolute value) at 60 MHz, respectively, as shown in FIG. 9. The multi-layered structure of the spiral inductor provides higher inductance and Q-values than the traditional inductors.

Figure 10:
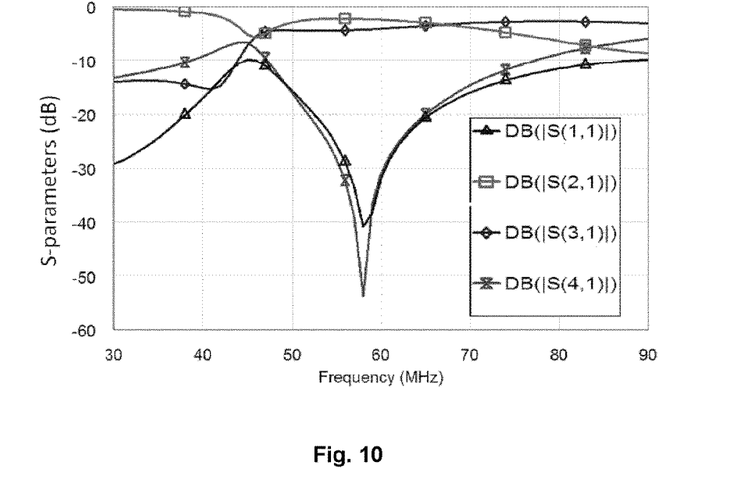
FIG. 10 shows electromagnetic simulation results of S-parameters of the quadrature hybrid shown in FIG. 3.

FIG. 10 shows electromagnetic simulation results of S-parameters of the quadrature hybrid 300 shown in FIG. 3. In FIG. 10, the horizontal axis represents frequency and the vertical axis represents S-parameter in dBs. Again, it is assumed that the first, second, third and fourth ports are input, direct, coupled and isolated ports, respectively. It can be seen that the S-parameter S(1,1) (i.e., input port reflection coefficient) is lower than −15 dB in the frequency range from 50 MHz to 70 MHz. That is, the design requirement is met. The S-parameters S(2, 1), S (3, 1) and S (4, 1) are better than −5 dB, −4 dB and −12 dB in the frequency range from 50 MHz to 70 MHz, respectively.

Figure 11:
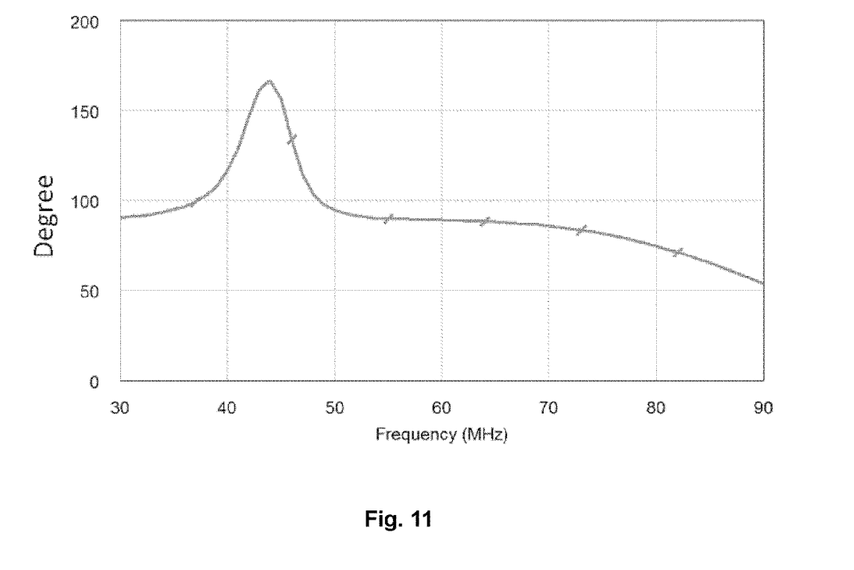
FIG. 11 shows electromagnetic simulation results of phase balance of the quadrature hybrid shown in FIG. 3.

FIG. 11 shows electromagnetic simulation results of phase balance of the quadrature hybrid 300 shown in FIG. 3. In FIG. 11, the horizontal axis represents frequency and the vertical axis represents phase balance in degrees. It can be seen that the phase balance (i.e., phase difference) between the coupled and direct ports is within 90±3° in the frequency range from 50 MHz to 70 MHz, which is desired for a quadrature hybrid.

Therefore, the quadrature hybrid achieves a fractional bandwidth of (70−50)/60=33.4%.

The overall dimension of the quadrature hybrid according to the disclosure can be only 10×11×1 (width×length×height) mm for working at 60 MHz. A size reduction of approximately 95% can be achieved when compared with the traditional quadrature hybrid based on microstrip lines. The multi-layered capacitors and inductors provide higher capacitance, inductance and Q-values. In addition, since the capacitors and inductors are buried into the multi-layered substrate, the performance of the quadrature hybrid is less vulnerable to environmental conditions, such as temperature, humidity and electromagnetic interferences. The quadrature hybrid has a simple topology with only three capacitors and four inductors, which is easy for circuit design and optimization.

Finally, the quadrature hybrid according to the disclosure also achieves a fractional bandwidth of (70−50)/60=33.4% and is thus suitable for wideband applications.

The disclosure has been described above with reference to embodiments thereof. It should be understood that various modifications, alternations and additions can be made by those skilled in the art without departing from the spirits and scope of the disclosure. Therefore, the scope of the disclosure is not limited to the above particular embodiments but only defined by the claims as attached.

The invention claimed is:

1. A quadrature hybrid having a first, second, third and fourth ports, the quadrature hybrid comprising: a substrate having a plurality of dielectric layers; a first, second and third capacitors, each capacitor having a first predetermined number of layers each being arranged on a different one of the plurality of dielectric layers; and a first, second, third and fourth inductors, each inductor having a second predetermined number of layers each being arranged on a different one of the plurality of dielectric layers, wherein a first terminal lead of the first inductor and a first terminal lead of the first capacitor are connected to the first port, a first terminal lead of the second inductor and a second terminal lead of the first capacitor are connected to the second port, a first terminal lead of the third inductor and a second terminal lead of the third capacitor are connected to the third port, a first terminal lead of the fourth inductor and a first terminal lead of the third capacitor are connected to the fourth port, a second terminal lead of the first inductor and a second terminal lead of the fourth inductor are connected to a first terminal lead of the second capacitor, and a second terminal lead of the second inductor and a second terminal lead of the third inductor are connected to a second terminal lead of the second capacitor, wherein the first and second terminal leads of each inductor are arranged in a first direction, and the first and second terminal leads of each capacitor are arranged in a second direction orthogonal to the first direction.

2. The quadrature hybrid of claim 1, wherein projections of the first, second and third capacitors on a surface of the substrate are squares having a same first size, the first and second terminal leads of each capacitor extending from a pair of opposite sides of the square on which the capacitor is projected, respectively.

3. The quadrature hybrid of claim 1, wherein projections of the first, second, third and fourth inductors on a surface of the substrate are squares having a same second size, the first and second terminal leads of each inductor extending from a pair of opposite sides of the square on which the inductor is projected, respectively.

4. The quadrature hybrid of claim 1, wherein each capacitor is a vertically-interdigital-capacitor.

5. The quadrature hybrid of claim 1, wherein each inductor is a spiral inductor.

6. The quadrature hybrid of claim 1, wherein each layer of the substrate is made of Low Temperature Co-fired Ceramic (LTCC) material.

7. The quadrature hybrid of claim 1, wherein the first and second predetermined number of layers comprises more than 3 layers.

* * * * *